United States Patent
Yoo

(10) Patent No.: US 10,374,054 B2
(45) Date of Patent: Aug. 6, 2019

(54) FERROELECTRIC MEMORY DEVICES

(71) Applicant: SK hynix Inc., Icheon-si (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/987,898

(22) Filed: May 24, 2018

(65) Prior Publication Data

US 2018/0374929 A1 Dec. 27, 2018

(30) Foreign Application Priority Data

Jun. 27, 2017 (KR) ........................ 10-2017-0081465

(51) Int. Cl.
*H01L 29/78* (2006.01)
*H01L 29/51* (2006.01)
*G11C 11/22* (2006.01)
*H01L 29/66* (2006.01)

(52) U.S. Cl.
CPC .......... *H01L 29/516* (2013.01); *G11C 11/223* (2013.01); *H01L 29/6684* (2013.01); *H01L 29/78391* (2014.09); *G11C 11/2275* (2013.01)

(58) Field of Classification Search
None
See application file for complete search history.

(56) References Cited

U.S. PATENT DOCUMENTS

| | | | |
|---|---|---|---|
| 6,906,366 B2 | 6/2005 | Hsu et al. | |
| 7,226,795 B2 | 6/2007 | Sakai | |
| 7,973,348 B1* | 7/2011 | Dalton | G11C 11/22 257/295 |
| 2006/0038242 A1* | 2/2006 | Hsu | H01L 29/516 257/407 |
| 2017/0141235 A1* | 5/2017 | Lai | H01L 29/78391 |

* cited by examiner

*Primary Examiner* — Minh Loan Tran

(57) ABSTRACT

A ferroelectric memory device includes a substrate having a source electrode and a drain electrode therein, a first interfacial dielectric layer including an anti-ferroelectric material disposed on the substrate between the source electrode and the drain electrode, a ferroelectric gate dielectric layer including a ferroelectric material disposed on the first interfacial dielectric layer, and a gate electrode disposed on the ferroelectric gate dielectric layer.

19 Claims, 8 Drawing Sheets

FERROELECTRIC MEMORY DEVICES

CROSS-REFERENCE TO RELATED APPLICATIONS

The present application claims priority under 35 U.S.C 119(a) to Korean Application No. 10-2017-0081465, filed on Jun. 27, 2017, which is herein incorporated by references in its entirety.

BACKGROUND

1. Technical Field

The present disclosure relates to ferroelectric memory devices.

2. Related Art

In general, a ferroelectric material may have spontaneous polarization in the absence of an external electric field. Specifically, the ferroelectric material may maintain any one of two different remanent polarization states. The remanent polarization states may be controlled or changed by an electric field applied to the ferroelectric material.

A remanent polarization state of the ferroelectric material may vary according to an electric field applied to the ferroelectric material. Thus, a lot of effort has been focused on applying the ferroelectric material to nonvolatile memory devices using the polarization characteristic of the ferroelectric material. That is, the ferroelectric material may be attractive as a candidate of a material employed in nonvolatile memory cells that store data corresponding to a logic "0" and a logic "1".

SUMMARY

According to an embodiment, there is provided a ferroelectric memory device. The ferroelectric memory device may include a substrate having a source electrode and a drain electrode therein, a first interfacial dielectric layer including an anti-ferroelectric material disposed on the substrate between the source electrode and the drain electrode, a ferroelectric gate dielectric layer including a ferroelectric material disposed on the first interfacial dielectric, and a gate electrode disposed on the ferroelectric gate dielectric layer.

According to another embodiment, there is provided a ferroelectric memory device. The ferroelectric memory device may include a semiconductor substrate, an insulation layer disposed on the semiconductor substrate, a first interfacial dielectric layer including an anti-ferroelectric material disposed on the insulation layer, a ferroelectric gate dielectric layer including a ferroelectric material disposed on the first interfacial dielectric, and a gate electrode disposed on the ferroelectric gate dielectric layer. The first interfacial dielectric layer has a dielectric constant which is higher than a dielectric constant of the insulation layer, and lattice constants of the interfacial dielectric layer are substantially identical to lattice constants of the ferroelectric gate dielectric layer.

DETAILED DESCRIPTION OF THE EMBODIMENTS

Figure 1:
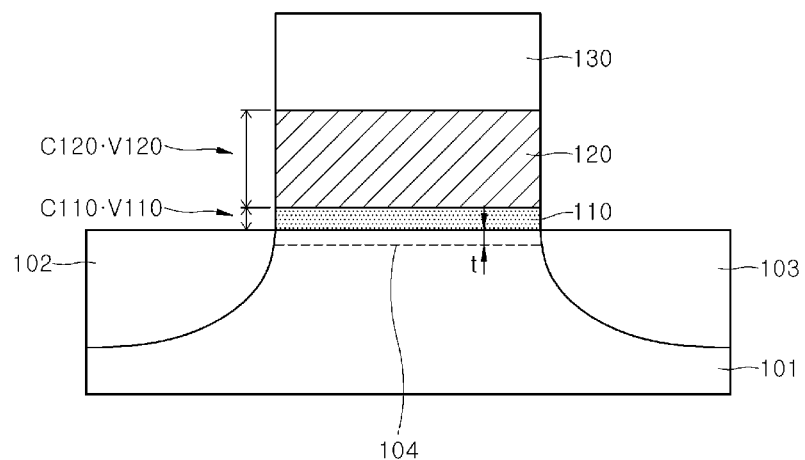
FIG. 1 is a cross-sectional view schematically illustrating a ferroelectric memory device according to an embodiment of the present disclosure.

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof. Furthermore, in method embodiments such as fabrication method embodiments, process steps of the methods may be performed in different sequences from the order which is described in the specification unless the context clearly indicates otherwise. That is, the process steps of the methods may be performed in the same sequence as described in the specification or in an opposite sequence thereto. Moreover, two or more process steps sequentially performed in an embodiment may be simultaneously performed in another embodiment.

Figure 2A:
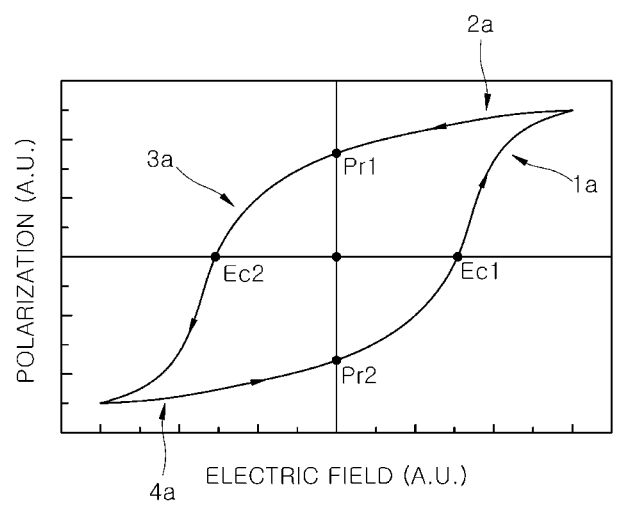
FIG. 2A is a graph illustrating a polarization hysteresis curve of a ferroelectric material employed in a ferroelectric memory device according to an embodiment of the present disclosure.
Figure 2B:
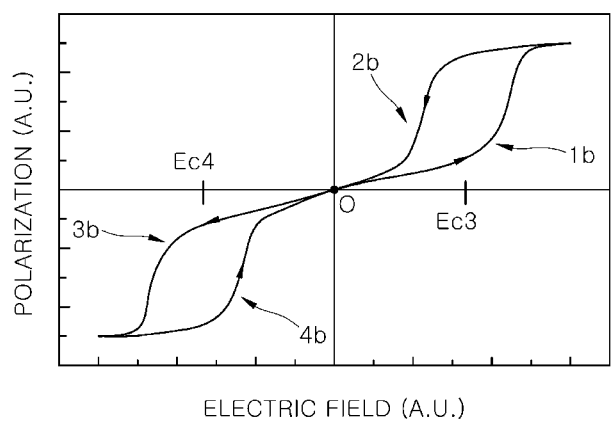
FIG. 2B is a graph illustrating a polarization hysteresis curve of an anti-ferroelectric material employed in a ferroelectric memory device according to an embodiment of the present disclosure.

FIG. 1 is a cross-sectional view illustrating a ferroelectric memory device 1 according to an embodiment of the present disclosure. FIG. 2A is a graph illustrating a polarization hysteresis curve of a ferroelectric material employed in the ferroelectric memory device 1 shown in FIG. 1, and FIG. 2B is a graph illustrating a polarization hysteresis curve of an anti-ferroelectric material employed in the ferroelectric memory device 1 shown in FIG. 1.

Referring to FIG. 1, the ferroelectric memory device 1 may include a substrate 101 having a source electrode 102 and a drain electrode 103 which are spaced apart from each other. In addition, the ferroelectric memory device 1 may further include an interfacial dielectric layer 110, a ferroelectric gate dielectric layer 120 and a gate electrode 130 which are sequentially stacked or disposed on the substrate 101 in an area between the source electrode 102 and the drain electrode 103.

In the ferroelectric memory device 1, a remanent polarization is formed in the ferroelectric gate dielectric layer 120 by applying a voltage between the gate electrode 130 and the substrate 101. The direction or bias and an intensity or strength of the remanent polarization formed in the ferroelectric gate dielectric layer 120 may be determined according to a polarity and a magnitude of the voltage. The remanent polarization formed in the ferroelectric gate dielectric layer 120 may induce carriers such as electrons or holes into an upper portion of the substrate 101 between the source electrode 102 and the drain electrode 103. Meanwhile, a channel region 104 as a conductive region is formed in the upper portion of the substrate 101 when a gate voltage is applied to the gate electrode 130. The channel region 104 is formed to have the same conductivity type as the source electrode 102 and the drain electrode 103, and an operation voltage is applied between the source electrode 102 and the drain electrode 103, then a drain current may flow through the channel region 104.

The induced carriers by the remanent polarization may change the resistance of the channel region 104 based on a concentration in the channel region 104. The concentration of the carriers induced in the channel region 104 may vary according to a direction of the remanent polarization in the ferroelectric gate dielectric layer 120. In addition, a thickness t of the channel region 104 having an induced electrical conductivity may be determined according to a concentration of the carriers induced in the channel region 104. In an example, the substrate 101 may be a P-type substrate, and the source electrode 102 and the drain electrode 103 may be N-type impurity regions. In such a case, if the remanent polarization in the ferroelectric gate dielectric layer 120 has a first direction which is capable of inducing electrons into the channel region 104, then the thickness t of the channel region 104 may increase due to the additional electrons induced into the channel region 104 by the remanent polarization. Thus, a resistance value of the channel region 104 may be reduced. Alternatively, if the remanent polarization in the ferroelectric gate dielectric layer 120 has a second direction which is capable of repulsing electrons distributed in the channel region 104, then the thickness t of the channel region 104 may be reduced by decreasing an electron concentration in the channel region 104. Thus, a resistance value of the channel region 104 may increase. As a result, once a direction of the remanent polarization in the ferroelectric gate dielectric layer 120 is determined, the ferroelectric memory device 1 may retain any one of a plurality of different logic data even without any external bias voltage, thereby acting as a nonvolatile memory cell.

Referring again to FIG. 1, the substrate 101 may include a semiconductor material. The substrate 101 may be a silicon (Si) substrate, a gallium arsenide (GaAs) substrate, an indium phosphide (InP) substrate, a germanium (Ge) substrate or a silicon germanium (SiGe) substrate, as non-limiting examples. The substrate 101 may be doped with N-type impurities or P-type impurities to have a conductivity.

The source electrode 102 and the drain electrode 103 may be disposed at both sides of the channel region 104, respectively. In an embodiment, the source electrode 102 and the drain electrode 103 may be impurity regions which are doped with dopants injected into portions of the substrate 101. The source electrode 102 and the drain electrode 103 may be formed to have a conductivity type which is different from a conductivity type of the substrate 101. For example, if the substrate 101 has a P-type conductivity, the source electrode 102 and the drain electrode 103 may have an N-type conductivity. In another embodiment, the source electrode 102 and the drain electrode 103 may be conductive patterns which are disposed in or on the substrate 101. The conductive patterns acting as the source electrode 102 and the drain electrode 103 may include a metal material, a conductive metal nitride material, a conductive silicide material or a doped semiconductor material.

The interfacial dielectric layer 110 and the ferroelectric gate dielectric layer 120 may be sequentially stacked or disposed on a portion of the substrate 101. The interfacial dielectric layer 110 and the ferroelectric gate dielectric layer 120 may be crystalline materials. In an embodiment, lattice constants of the interfacial dielectric layer 110 are substantially identical to lattice constants of the ferroelectric gate dielectric layer 120. In another embodiment, a difference between lattice constants of the interfacial dielectric layer 110 and the ferroelectric gate dielectric layer 120 may be equal to or less than 3% of the lattice constants of the ferroelectric gate dielectric layer 120. As the difference of the lattice constants decrease, a size of a depolarization electric field caused by the difference of the lattice constants may decrease. The depolarization electric field may weaken ferroelectric properties of the ferroelectric gate dielectric layer 120 as will be described below.

The interfacial dielectric layer 110 may include an antiferroelectric material. The interfacial dielectric layer 110 may include a hafnium oxide material, a zirconium oxide material, a hafnium zirconium oxide material, or a combination containing at least two different materials thereof. The interfacial dielectric layer 110 may have a cubic crystalline structure or a tetragonal crystalline structure. The interfacial dielectric layer 110 may have a thickness of approximately two (2) nanometers (nm) to approximately five (5) nanometers (nm).

The ferroelectric gate dielectric layer 120 may include a ferroelectric material. In an embodiment, the ferroelectric gate dielectric layer 120 may include a metal oxide material. The ferroelectric gate dielectric layer 120 may include a hafnium oxide material, a zirconium oxide material, a hafnium zirconium oxide material, or a combination containing at least two different materials thereof, as non-limiting examples. The ferroelectric gate dielectric layer 120 may have an orthorhombic crystalline structure. The ferroelectric gate dielectric layer 120 may have a thickness of approximately five (5) nanometers (nm) to approximately ten (10) nanometers (nm).

In an embodiment, the ferroelectric gate dielectric layer 120 may be doped with dopants. The dopants injected into the ferroelectric layer 120 may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination containing at least two different elements thereof.

The gate electrode 130 may include a metal material, a conductive metal nitride material, a conductive metal oxide material or a conductive silicide material. The gate electrode 130 may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof, as non-limiting examples.

In an embodiment, the substrate 101 may be a silicon substrate, and the interfacial dielectric layer 110 may include an anti-ferroelectric material such as a hafnium oxide (HfO) material, a zirconium oxide (ZrO) material, a hafnium zirconium oxide (HfZrO) material or a combination containing at least two different materials thereof if the ferroelectric gate dielectric layer 120 is a ferroelectric hafnium oxide layer. In a specific embodiment, the interfacial dielectric layer 110 may be an anti-ferroelectric layer such as a zirconium oxide (ZrO) layer.

Generally, if the ferroelectric gate dielectric layer including a ferroelectric material is in contact with a heterogeneous material layer to provide an interface between the ferroelectric gate dielectric layer and the heterogeneous material layer, then a depolarization electric field may be created across the ferroelectric gate dielectric layer. The depolarization electric field may degrade the alignment property of polarization in the ferroelectric gate dielectric layer and weaken its ferroelectric properties.

According to one of various theories of creation of a depolarization electric field, a continuity of chemical bonds in the ferroelectric gate dielectric layer may be broken at the interface between the ferroelectric gate dielectric layer and the heterogeneous material layer. If the ferroelectric gate dielectric layer and the heterogeneous material layer are in contact with each other with an interface therebetween, a stress may be applied to the ferroelectric gate dielectric layer in the interface due to a difference between the lattice constants of the ferroelectric gate dielectric layer and the heterogeneous material layer. The depolarization electric field across the ferroelectric gate dielectric layer is reflected in or corresponds to a gradient profile of the stress from the interface into the inner region of the ferroelectric gate dielectric layer.

According to another one of the various theories of creation of the depolarization electric field, if the ferroelectric gate dielectric layer includes a metal oxide material, a completion property (e.g., valence property) of chemical bonds in the metal oxide material may be degraded at a surface region of the metal oxide material adjacent to the interface between the metal oxide material and the heterogeneous material layer. Thus, oxygen vacancies having positive charges may be formed in the surface region of the metal oxide material adjacent to the interface between the metal oxide material and the heterogeneous material layer. The oxygen vacancies may create a gradient concentration profile of the positive charges in the metal oxide material that forms a depolarization electric field across the metal oxide material.

According to the various theories of creation of the depolarization electric field, a depolarization electric field across the metal oxide material may degrade the alignment property of the polarization of the ferroelectric gate dielectric layer. Thus, the reliability of data stored in a ferroelectric memory device may be degraded.

According to an embodiment, the interfacial dielectric layer 110 disposed between the substrate 101 and the ferroelectric gate dielectric layer 120 may have an anti-ferroelectric property. The interfacial dielectric layer 110 suppresses creation of the depolarization electric field or limits the effect of a depolarization electric field compared with interfacial dielectric layers without anti-ferroelectric or paraelectric properties. The interfacial dielectric layer 110 and the ferroelectric gate dielectric layer 120 may each include a metal oxide material. In an embodiment, lattice constants of the interfacial dielectric layer 110 are substantially identical to lattice constants of the ferroelectric gate dielectric layer 120. In another embodiment, a difference between lattice constants of the interfacial dielectric layer 110 and the ferroelectric gate dielectric layer 120 may be equal to or less than 3% of the lattice constant of the ferroelectric gate dielectric layer 120. This may suppress or reduce generation of, or limit, the strain between the interfacial dielectric layer 110 and the ferroelectric gate dielectric layer 120 or suppress or curb generation of the oxygen vacancies in the ferroelectric gate dielectric layer 120. As a result, it is possible to suppress creation of a depolarization electric field that spans across the ferroelectric gate dielectric layer 120 compared with conventional devices. In such a case, the ferroelectric gate dielectric layer 120 may have a thickness of approximately five (5) nanometers (nm) to approximately ten (10) nanometers (nm), and the interfacial dielectric layer 110 may have a thickness of approximately two (2) nanometers (nm) to approximately five (5) nanometers (nm).

FIG. 2A is a graph illustrating a polarization hysteresis curve of a ferroelectric material employed in the ferroelectric gate dielectric layer 120, and FIG. 2B is a graph illustrating a polarization hysteresis curve of an anti-ferroelectric material used in the interfacial dielectric layer 110. In FIGS. 2A and 2B, the abscissas denote an electric field in an arbitrary unit, and the ordinates denote a polarization value in an arbitrary unit. Referring to FIG. 2A, the ferroelectric material employed in the ferroelectric gate dielectric layer 120 may have a variable polarization value along curves 1a, 2a, 3a and 4a if an electric field is applied to or removed from the ferroelectric material. The ferroelectric material may be put in a first coercive field Ec1 or a second coercive field Ec2 and may have a first remanent polarization Pr1 or a second remanent polarization Pr2, as illustrated in FIG. 2A. Referring to FIG. 2B, the anti-ferroelectric material may have a variable polarization value along curves 1b, 2b, 3b and 4b when an electric field is applied to or removed from the anti-ferroelectric material. The anti-ferroelectric material may be put in a first threshold field Ec3 or a second threshold field Ec4 along lines 1b and 3b as illustrated in FIG. 2B. In such a case, if an electric field applied to the anti-ferroelectric material is equal to or higher than an absolute value of the first or second threshold field Ec3 or Ec4, the polarization of the anti-ferroelectric material increases relatively greatly such that that the anti-ferroelectric material may have a high polarization property. If the electric field applied to the anti-ferroelectric material is removed, the anti-ferroelectric material may experience some loss of the high polarization property.

In an embodiment, if an electric field equal to or higher than an absolute value of the first or second threshold field Ec3 or Ec4 is applied to the interfacial dielectric layer 110 during a write operation of the ferroelectric memory device 1, then the high polarization property of the interfacial dielectric layer 110 may result in an electric field that improves alignment of polarization in the adjoining ferroelectric gate dielectric layer 120. At this time, an orientation of the polarization in the interfacial dielectric layer 110 is substantially identical to an orientation of the polarization in the ferroelectric gate dielectric layer 120. When the electric field applied to the interfacial dielectric layer 110 is removed, an alignment property of the polarization created in the ferroelectric gate dielectric layer 120 may still exhibit an improved alignment property. After the electric field applied to the interfacial dielectric layer 110 is removed, the polarization created in the interfacial dielectric layer 110 may be limited or may disappear.

Figure 3A:
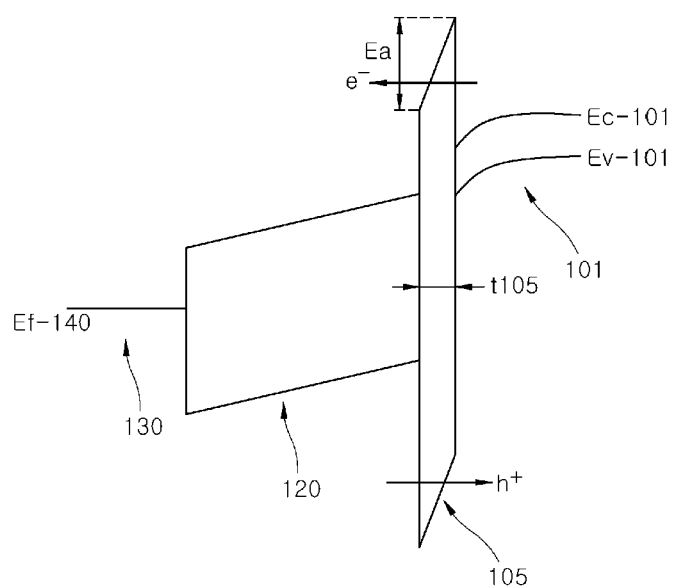
FIG. 3A is an energy band diagram of a MOS structure employed in a ferroelectric memory device according to a comparative example of the present disclosure.
Figure 3B:
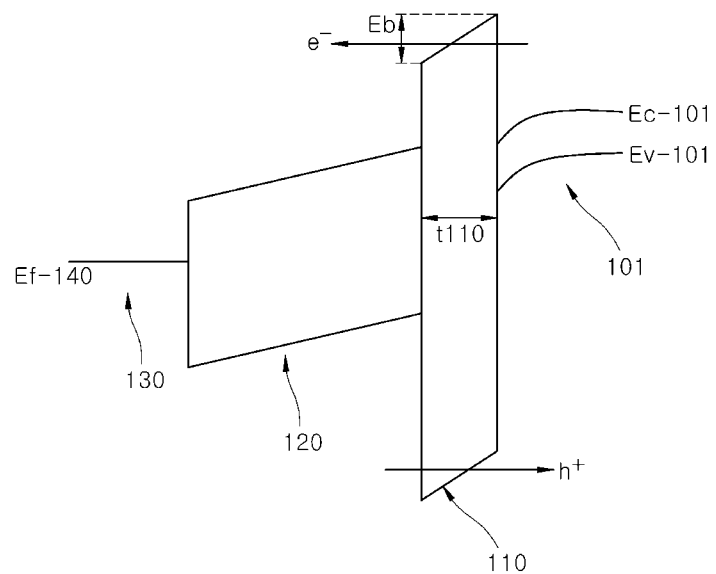
FIG. 3B is an energy band diagram of a MOS structure employed in a ferroelectric memory device according to an embodiment of the present disclosure.

FIG. 3A is an energy band diagram of a MOS structure employed in a ferroelectric memory device 11 according to a comparative example of the present disclosure. FIG. 3B is an energy band diagram of a MOS structure employed in a ferroelectric memory device 12 according to an embodiment of the present disclosure. The ferroelectric memory device 12 illustrated in FIG. 3B may have substantially the same configuration as the ferroelectric memory device 1 described above and with reference to FIG. 1. The ferroelectric memory device 11 illustrated in FIG. 3A may be configured to include an interfacial dielectric layer 105 instead of the interfacial dielectric layer 110 of the ferroelectric memory device 12 illustrated in FIG. 3B. The interfacial dielectric layer 105 of the ferroelectric memory device 11 illustrated in FIG. 3A may include a conventional silicon oxide material or a conventional silicon nitride material, and the interfacial dielectric layer 110 of the ferroelectric memory device 12 illustrated in FIG. 3B may include an anti-ferroelectric material. In an embodiment, the anti-ferroelectric material used as the interfacial dielectric layer 110 may include a hafnium oxide (HfO) material, a zirconium oxide (ZrO) material, a hafnium zirconium oxide (HfZrO) material, or a combination containing at least two different materials thereof. Accordingly, the interfacial dielectric layer 110 of the ferroelectric memory device 12 illustrated in FIG. 3B may have a dielectric constant which is higher than a dielectric constant of the interfacial dielectric layer 105 of the ferroelectric memory device 11 illustrated in FIG. 3A.

In case of the ferroelectric memory device 1 illustrated in FIG. 1, the interfacial dielectric layer 110 and the ferroelectric gate dielectric layer 120 may be electrically coupled in series between the substrate 101 and the gate electrode 130. Thus, if a voltage is applied to the gate electrode 130, an amount of charges induced in a capacitor comprised of the interfacial dielectric layer 110 may be equal to an amount of charges induced in a capacitor comprised of the ferroelectric gate dielectric layer 120. Thus, the product of a capacitance value C110 of the interfacial dielectric layer 110 by a voltage V110 induced across the interfacial dielectric layer 110 may be equal to the product of a capacitance value C120 of the ferroelectric gate dielectric layer 120 by a voltage V120 induced across the ferroelectric gate dielectric layer 120.

Accordingly, the higher a ratio of the capacitance value C120 of the ferroelectric gate dielectric layer 120 to the capacitance value C110 of the interfacial dielectric layer 110 becomes, the higher the voltage V110 induced across the interfacial dielectric layer 110 becomes. In the ferroelectric memory device 1 illustrated in FIG. 1, the capacitance value C110 of the interfacial dielectric layer 110 may be proportional to a dielectric constant of the interfacial dielectric layer 110, and the capacitance value C120 of the ferroelectric gate dielectric layer 120 may be proportional to a dielectric constant of the ferroelectric gate dielectric layer 120. Thus, the higher a ratio of the dielectric constant of the ferroelectric gate dielectric layer 120 to the dielectric constant of the interfacial dielectric layer 110 is, the higher the voltage V110 induced across the interfacial dielectric layer 110 is.

In the comparative example illustrated in FIG. 3A, if a positive voltage is applied to the gate electrode 130 while the substrate 101 is grounded, the Fermi level "Ef-140" of the gate electrode 130 may be lowered relative to the bend of valence and conduction bands "Ev-101" and "Ec-101" of the substrate 101. In such a case, the interfacial dielectric layer 105 may provide a barrier having a first barrier energy Ea between the substrate 101 and the ferroelectric gate dielectric layer 120. Similarly, in the embodiment illustrated in FIG. 3B, if a positive voltage is applied to the gate electrode 130 while the substrate 101 is grounded, the Fermi level "Ef-140" of the gate electrode 130 may be lowered relative to the bend of valence and conduction bands "Ev-101" and "Ec-101" of the substrate 101. In such a case, the interfacial dielectric layer 110 may provide a barrier having a second barrier energy Eb between the substrate 101 and the ferroelectric gate dielectric layer 120. Referring to FIGS. 3A and 3B, when the same voltage is applied to the gate electrodes 130 of FIGS. 3A and 3B, a voltage induced across the interfacial dielectric layer 105 in FIG. 3A may be greater than a voltage induced across the interfacial dielectric layer 110 in FIG. 3B because a dielectric constant of the interfacial dielectric layer 105 in FIG. 3A is less than a dielectric constant of the interfacial dielectric layer 110 in FIG. 3B. Thus, the first barrier energy Ea in FIG. 3A may be higher or larger than the second barrier energy Eb in FIG. 3B. In such a case, the energy band of the interfacial dielectric layer 105 may be bent to have a slope which may be steeper than a slope of the energy band of the interfacial dielectric layer 110, as illustrated in FIGS. 3A and 3B. Accordingly, a distance that carriers (e.g., electrons "e$^-$" or holes "h$^+$") must travel through the interfacial dielectric layer 105 between the substrate 101 and the ferroelectric gate dielectric layer 120 in FIG. 3A may be relatively smaller as compared with a substantial length of a path that carriers (e.g., electrons "e$^-$" or holes "h$^+$") pass through the interfacial dielectric layer 110 in FIG. 3B. At this time, the decrease amount of the traveling distance with respect to the interfacial dielectric layer 105 with a thickness t105 may be larger than the decrease amount of the traveling distance with respect to the interfacial dielectric layer 110 with a thickness t110. As a result, when the same voltage is applied to the gate electrodes 130 of FIGS. 3A and 3B, the probability that the carriers tunnel and penetrate the interfacial dielectric layer 105 in FIG. 3A may be higher than the probability that the carriers tunnel and penetrate the interfacial dielectric layer 110 in FIG. 3B. For example, a probability that the carriers penetrate the interfacial dielectric layer 105 by a Fowler-Nordheim (F-N) tunneling mechanism may be higher than a probability that the carriers penetrate the interfacial dielectric layer 110 by an F-N tunneling mechanism. The carriers that tunnel and penetrate the interfacial dielectric layer 105 may generate a leakage current to adversely affect the function of the ferroelectric memory device 11 illustrated in FIG. 3A. In contrast, the tunneling probability that the carriers penetrate the interfacial dielectric layer 110 is relatively low as compared with the tunneling probability that the carriers penetrate the interfacial dielectric layer 105, as described above. That is, the interfacial dielectric layer 110 may suppress or reduce the generation of, or limit, a leakage current in the ferroelectric memory device 12 illustrated in FIG. 3B.

Moreover, a dielectric constant of the interfacial dielectric layer 110 illustrated in FIG. 3B may be higher than a dielectric constant of the interfacial dielectric layer 105 illustrated in FIG. 3A, as described above. Thus, when the ferroelectric memory devices 11 and 12 are designed so that a capacitance value of the interfacial dielectric layer 105 is equal to a capacitance value of the interfacial dielectric layer 110, a thickness t110 of the interfacial dielectric layer 110 could be greater than a thickness t105 of the interfacial dielectric layer 105. Consequently, it may be possible to more effectively suppress or reduce the generation of a leakage current, or limit leakage current, flowing through the thicker interfacial dielectric layer 110.

Figure 4:
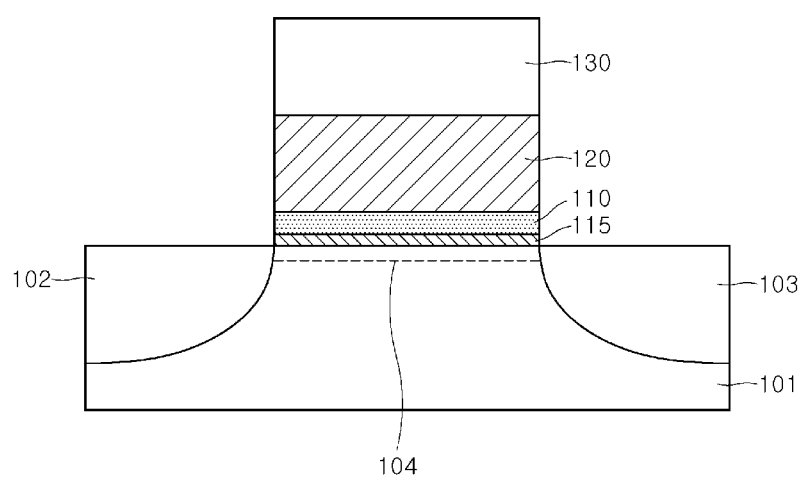
FIG. 4 is a cross-sectional view schematically illustrating a ferroelectric memory device according to another embodiment of the present disclosure.

FIG. 4 is a cross-sectional view illustrating a ferroelectric memory device 2 according to another embodiment of the present disclosure. Referring to FIG. 4, the ferroelectric memory device 2 may have substantially the same configuration as the ferroelectric memory device 1 illustrated in FIG. 1, except that an insulation layer 115 is additionally disposed between the substrate 101 and the interfacial dielectric layer 110. In an embodiment, a stack structure including the insulation layer 115 and the interfacial dielectric layer 110 may be provided between the substrate 101 and the gate electrode 130 to act as a lower interfacial structure.

The insulation layer 115 may be disposed on the substrate 101. The insulation layer 115 may include a silicon oxide material, a silicon nitride material, a silicon oxynitride material, an aluminum oxide material or a combination containing at least two different materials thereof, as non-limiting examples. In an embodiment, if the substrate 101 is a silicon substrate, the insulation layer 115 may be a silicon oxide layer. The insulation layer 115 may have a thickness which is equal to or less than one (1) nanometer (nm). The insulation layer 115 may additionally suppress or block travel of carriers such as electrons or holes moving from the substrate 101 toward the gate electrode 130, or vice versa. The interfacial dielectric layer 110, the ferroelectric gate dielectric layer 120 and the gate electrode 130 may be sequentially stacked or disposed on a surface of the insulation layer 115 opposite to the substrate 101.

Figure 5:
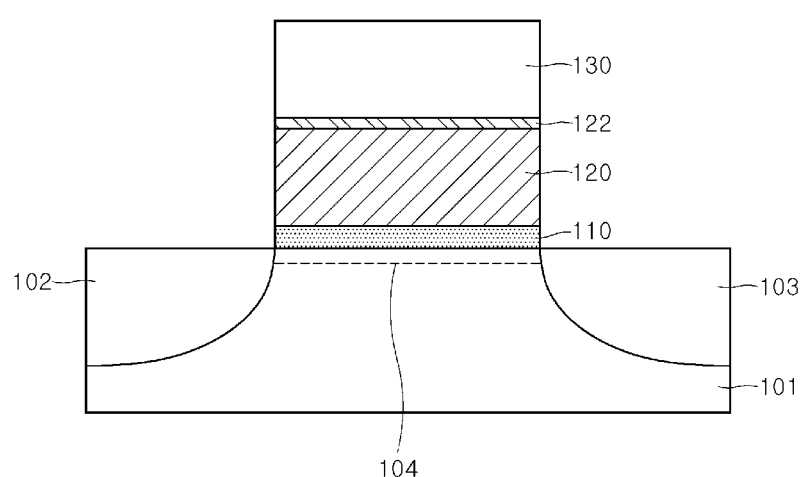
FIG. 5 is a cross-sectional view schematically illustrating a ferroelectric memory device according to yet another embodiment of the present disclosure.

FIG. 5 is a cross-sectional view illustrating a ferroelectric memory device 3 according to yet another embodiment of the present disclosure. Referring to FIG. 5, the ferroelectric memory device 3 may have substantially the same configuration as the ferroelectric memory device 1 illustrated in FIG. 1, and may be configured to additionally include an interfacial dielectric layer 122 disposed between the ferroelectric gate dielectric layer 120 and the gate electrode 130. Accordingly, the interfacial dielectric layer 110 may correspond to a first interfacial dielectric layer, and the interfacial dielectric layer 122 may correspond to a second interfacial dielectric layer.

The second interfacial dielectric layer 122 may have a para-electric property or an anti-ferroelectric property. The second interfacial dielectric layer 122 may have a bandgap energy which is greater than a bandgap energy of the ferroelectric gate dielectric layer 120. Thus, a height of an interfacial energy barrier between the ferroelectric gate dielectric layer 120 and the gate electrode 130 may increase due to the presence of the second interfacial dielectric layer 122. In addition, the second interfacial dielectric layer 122, having a predetermined or set thickness and disposed between the ferroelectric gate dielectric layer 120 and the gate electrode 130, may function as a leakage conduction barrier. As a result, a leakage current between the ferroelectric gate dielectric layer 120 and the gate electrode 130 may be reduced or limited as compared with conventional devices.

The second interfacial dielectric layer 122 may include a metal oxide material. The metal oxide material used as the second interfacial dielectric layer 122 may include a silicon oxide material, a magnesium oxide material, a calcium oxide material, a strontium oxide material, a barium oxide material, an aluminum oxide material, a gallium oxide material, an yttrium oxide material, a scandium oxide material, a tantalum oxide material, a zirconium oxide material, a hafnium zirconium oxide material, a titanium oxide material, a lanthanum oxide material, a gadolinium oxide material, a zirconium silicon oxide material, a hafnium silicon oxide material, a titanium silicon oxide material or a combination material containing at least two different materials thereof, as non-limiting examples. The second interfacial dielectric layer 122 may have a thickness which is equal to or less than one (1) nanometer (nm). In such a case, the gate electrode 130 may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof.

The second interfacial dielectric layer 122 may be employed in the ferroelectric memory device 3 to further suppress, limit or block a leakage current between the ferroelectric gate dielectric layer 120 and the gate electrode 130.

In some other embodiments, although not shown in the drawings, an insulation layer may be additionally disposed between the substrate 101 and the first interfacial dielectric layer 110 illustrated in FIG. 5. The insulation layer may be substantially the same as the insulation layer 115 described above and with reference to FIG. 4.

Figure 6:
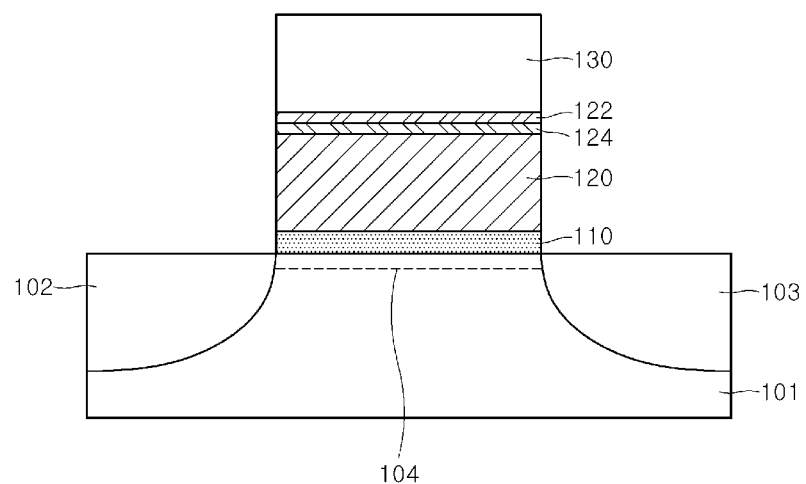
FIG. 6 is a cross-sectional view schematically illustrating a ferroelectric memory device according to still another embodiment of the present disclosure.

FIG. 6 is a cross-sectional view illustrating a ferroelectric memory device 4 according to still another embodiment of the present disclosure. Referring to FIG. 6, the ferroelectric memory device 4 may be configured to additionally include a third interfacial dielectric layer 124 disposed between the second interfacial dielectric layer 122 and the ferroelectric gate dielectric layer 120 compared with the ferroelectric memory device 3 illustrated in FIG. 5. That is, the ferroelectric memory device 4 may include first, second and third interfacial dielectric layers 110, 122 and 124.

The third interfacial dielectric layer 124 may have a para-electric property or an anti-ferroelectric property. The third interfacial dielectric layer 124 may include a hafnium oxide material, a zirconium oxide material, a hafnium zirconium oxide material or a combination containing at least two different materials thereof, as non-limiting examples. In an embodiment, lattice constants of the third interfacial layer 124 are substantially identical to lattice constants of the ferroelectric gate dielectric layer 120. In another embodiment, a difference between lattice constants of the ferroelectric gate dielectric layer 120 and the third interfacial dielectric layer 124 may be equal to or less than 3% of the lattice constant of the ferroelectric gate dielectric layer 120. The third interfacial dielectric layer 124 may have a thickness which is equal to or less than one (1) nanometer (nm).

The second interfacial dielectric layer 122 may be employed in the ferroelectric memory device 4 to suppress, limit or block a leakage current between the ferroelectric gate dielectric layer 120 and the gate electrode 130, and the third interfacial dielectric layer 124 may be employed in the ferroelectric memory device 4 to act as a buffer layer for preventing an abrupt variation between the lattice constants of the ferroelectric gate dielectric layer 120 and the second interfacial dielectric layer 122. As described above, the abrupt variation of the lattice constants may generate the depolarization electric field in the ferroelectric gate dielectric layer 120. In an embodiment, the third interfacial dielectric layer 124 may have lattice constants that are between lattice constants of the ferroelectric gate dielectric layer 120 and lattice constants of the second interfacial dielectric layer 122.

In an embodiment, if the ferroelectric gate dielectric layer 120 is a ferroelectric hafnium oxide layer, then the third interfacial dielectric layer 124 may include a zirconium oxide material. In such a case, the second interfacial dielectric layer 122 may include an aluminum oxide material, and the gate electrode 130 may include a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material, a tantalum silicide (TaSi) material or a combination material containing at least two different materials thereof. The third interfacial dielectric layer 124 including the zirconium oxide material may act as a buffer layer for preventing an abrupt variation between the lattice constants of the ferroelectric gate dielectric layer 120 including the hafnium oxide material and the second interfacial dielectric layer 122 including the aluminum oxide material.

In some other embodiments, although not shown in the drawings, an insulation layer may be additionally disposed between the substrate 101 and the first interfacial dielectric layer 110 illustrated in FIG. 6. The insulation layer may be substantially the same material layer as the insulation layer 115 described above and with reference to FIG. 4.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A ferroelectric memory device comprising:
a substrate having a source electrode and a drain electrode;
a first interfacial dielectric layer including an anti-ferroelectric material disposed on the substrate between the source electrode and the drain electrode;
a ferroelectric gate dielectric layer including a ferroelectric material disposed on the first interfacial dielectric; and
a gate electrode disposed on the ferroelectric gate dielectric layer,
wherein lattice constants of the first interfacial dielectric layer is substantially identical to lattice constants of the ferroelectric gate dielectric layer.

2. The ferroelectric memory device of claim 1, wherein the first interfacial dielectric layer includes at least one of a hafnium oxide material, a zirconium oxide material and a hafnium zirconium oxide material.

3. The ferroelectric memory device of claim 1, wherein the ferroelectric gate dielectric layer includes at least one of a hafnium oxide material, a zirconium oxide material and a hafnium zirconium oxide material.

4. The ferroelectric memory device of claim 1,
wherein the ferroelectric gate dielectric layer is doped with dopants; and
wherein the dopants include at least one element of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd) and lanthanum (La).

5. The ferroelectric memory device of claim 1, further comprising an insulation layer disposed between the substrate and the first interfacial dielectric layer,
wherein the insulation layer incudes at least one of a silicon oxide material, a silicon nitride material, a silicon oxynitride material and an aluminum oxide material.

6. The ferroelectric memory device of claim 1, wherein the gate electrode includes at least one of a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material and a tantalum silicide (TaSi) material.

7. The ferroelectric memory device of claim 1, further comprising a second interfacial dielectric layer disposed between the ferroelectric gate dielectric layer and the gate electrode,
wherein the second interfacial dielectric layer includes a metal oxide material having a para-electric property or an anti-ferroelectric property.

8. The ferroelectric memory device of claim 7, wherein the second interfacial dielectric layer has a bandgap energy which is greater than a bandgap energy of the ferroelectric gate dielectric layer.

9. The ferroelectric memory device of claim 7, further comprising a third interfacial dielectric layer disposed between the ferroelectric gate dielectric layer and the second interfacial dielectric layer,
wherein lattice constants of the ferroelectric gate dielectric layer are substantially identical to lattice constants of the third interfacial dielectric layer.

10. A ferroelectric memory device comprising:
a semiconductor substrate;
an insulation layer disposed on the semiconductor substrate;
a first interfacial dielectric layer including an anti-ferroelectric material disposed on the insulation layer;
a ferroelectric gate dielectric layer including a ferroelectric material disposed on the first interfacial dielectric; and
a gate electrode disposed on the ferroelectric gate dielectric layer,
wherein the first interfacial dielectric layer has a dielectric constant which is greater than a dielectric constant of the insulation layer, and
wherein lattice constants of the first interfacial dielectric layer are substantially identical to lattice constants of the ferroelectric gate dielectric layer.

11. The ferroelectric memory device of claim 10, wherein the insulation layer incudes at least one of a silicon oxide material, a silicon nitride material, a silicon oxynitride material and an aluminum oxide material.

12. The ferroelectric memory device of claim 10, wherein the first interfacial dielectric layer includes at least one of a hafnium oxide material, a zirconium oxide material and a hafnium zirconium oxide material.

13. The ferroelectric memory device of claim 10, wherein the ferroelectric gate dielectric layer includes at least one of a hafnium oxide material, a zirconium oxide material and a hafnium zirconium oxide material.

14. The ferroelectric memory device of claim 10, further comprising a second interfacial dielectric layer and a third interfacial dielectric layer which are disposed between the ferroelectric gate dielectric layer and the gate electrode,
wherein the second interfacial dielectric layer and the third interfacial dielectric layer have a para-electric or an anti-ferroelectric properties.

15. The ferroelectric memory device of claim 14, wherein the second interfacial dielectric layer has a bandgap energy which is greater than a bandgap energy of the ferroelectric gate dielectric layer.

16. The ferroelectric memory device of claim 15,
wherein the third interfacial dielectric layer is disposed between the ferroelectric gate dielectric layer and the second interfacial dielectric layer; and
wherein lattice constants of the third interfacial dielectric layer are substantially identical to lattice constants of the ferroelectric gate dielectric layer.

17. The ferroelectric memory device of claim 10, wherein the gate electrode includes at least one of a tungsten (W) material, a titanium (Ti) material, a copper (Cu) material, an aluminum (Al) material, a platinum (Pt) material, an iridium (Ir) material, a ruthenium (Ru) material, a tungsten nitride (WN) material, a titanium nitride (TiN) material, a tantalum nitride (TaN) material, an iridium oxide (IrO) material, a ruthenium oxide (RuO) material, a tungsten carbide (WC) material, a titanium carbide (TiC) material, a tungsten silicide (WSi) material, a titanium silicide (TiSi) material and a tantalum silicide (TaSi) material.

18. The ferroelectric memory device of claim 10, further comprising a source electrode and a drain electrode disposed in the semiconductor substrate,
wherein the insulation layer is disposed on a channel region located in the substrate and between the source electrode and the drain electrode.

19. The ferroelectric memory device of claim 18, wherein the source electrode and the drain electrode have a conductivity type which is different from a conductivity type of the semiconductor substrate.

* * * * *